(12) United States Patent
Nogami et al.

(10) Patent No.: US 11,274,371 B2
(45) Date of Patent: Mar. 15, 2022

(54) SUSCEPTOR AND EPITAXIAL GROWTH DEVICE

(71) Applicant: SUMCO CORPORATION, Tokyo (JP)

(72) Inventors: Shoji Nogami, Tokyo (JP); Naoyuki Wada, Tokyo (JP); Masaya Sakurai, Tokyo (JP); Takayuki Kihara, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 159 days.

(21) Appl. No.: 15/567,148

(22) PCT Filed: Apr. 22, 2016

(86) PCT No.: PCT/JP2016/002164
§ 371 (c)(1),
(2) Date: Oct. 17, 2017

(87) PCT Pub. No.: WO2016/174859
PCT Pub. Date: Nov. 3, 2016

(65) Prior Publication Data
US 2018/0100235 A1  Apr. 12, 2018

(30) Foreign Application Priority Data

Apr. 27, 2015 (JP) .............................. JP2015-090559

(51) Int. Cl.
*C23C 16/458* (2006.01)
*C30B 25/12* (2006.01)
(Continued)

(52) U.S. Cl.
CPC ........ *C23C 16/458* (2013.01); *C23C 16/4586* (2013.01); *C30B 25/12* (2013.01);
(Continued)

(58) Field of Classification Search
CPC ..... C23C 16/458; C30B 25/12; H01L 21/205; H01L 21/67739
See application file for complete search history.

(56) References Cited

U.S. PATENT DOCUMENTS 5,584,936 A * 12/1996 Pickering ............ C23C 16/4583
118/500
8,980,001 B2 3/2015 Sakurai et al.
(Continued)

FOREIGN PATENT DOCUMENTS

JP  H07-130658 A  5/1995
JP  H08-316222 A  11/1996
(Continued)

OTHER PUBLICATIONS

Machine Translation of JP11-163102, published Jun. 18, 1999, all pages (Year: 1999).*

(Continued)

*Primary Examiner* — Keath T Chen
*Assistant Examiner* — Margaret D Klunk
(74) *Attorney, Agent, or Firm* — Greenblum & Bernstein, P.L.C.

(57) ABSTRACT

Provided is a susceptor, capable of preventing occurrence of scratches on the back surface of a wafer attributable to lift pins, and reducing unevenness of the in-surface temperature distribution of the wafer. A susceptor according to one embodiment of this disclosure has a susceptor main body and a plate-shaped member, and when a wafer is conveyed, the front surface of the plate-shaped member ascended by lift pins supports the central part of the back surface of the wafer by surface contact. A separation space between the plate-shaped member and the susceptor main body, in a state in which the plate-shaped member is placed on the recessed part, enters further into the central side of the plate-shaped (Continued)

I-I enlarged section view member, in a direction from the front surface to the back surface of the susceptor.

9 Claims, 11 Drawing Sheets

(51) Int. Cl.
    *H01L 21/677*     (2006.01)
    *C30B 29/06*     (2006.01)
    *H01L 21/205*     (2006.01)
    *H01L 21/687*     (2006.01)

(52) U.S. Cl.
    CPC ............ *C30B 29/06* (2013.01); *H01L 21/205* (2013.01); *H01L 21/677* (2013.01); *H01L 21/67739* (2013.01); *H01L 21/68742* (2013.01)

(56) References Cited

U.S. PATENT DOCUMENTS

| | | | |
|---|---|---|---|
| 2003/0015141 A1 | 1/2003 | Takagi | |
| 2009/0272323 A1* | 11/2009 | Ito | C23C 16/4583 118/725 |

FOREIGN PATENT DOCUMENTS

| | | | |
|---|---|---|---|
| JP | 11-163102 A | | 6/1999 |
| JP | 2001-313329 A | | 2/2004 |
| JP | 2004-063865 A | | 2/2004 |
| JP | 2005-197380 A | | 7/2005 |
| JP | 2006124758 A | * | 5/2006 |
| JP | 2009-270143 A | | 11/2009 |
| JP | 2010-074037 A | | 4/2010 |
| JP | 2011-146506 A | | 7/2011 |

OTHER PUBLICATIONS

Machine Translation of JP 2010-074037, published Apr. 2, 2010, 7 pages (Year: 2010).*
U.S. Appl. No. 15/567,159 to Shoji Nogami et al., filed Oct. 17, 2017.
Official Communication issued in WIPO Application No. PCT/JP2016/002164, dated Jul. 26, 2016.
Official Communication issued in WIPO Application No. PCT/JP2016/002164, dated Oct. 31, 2017.
Office Action issued in Japanese family member Patent Appl. No. 2015-090559, dated Jul. 10, 2018, along with an English translation thereof.
Office Action issued in Korean family member Patent Appl. No. 10-2017-7029627, dated Mar. 12, 2019, along with an English translation thereof.
Office Action issued in Chinese Counterpart Patent Appl. No. 201680024187.6, dated Nov. 7, 2020, along with an English translation thereof.
Office Action issued in Chinese Counterpart Patent Appl. No. 201680024187.6, dated Apr. 12, 2021, along with an English translation thereof.

* cited by examiner

I-I enlarged section view

II-II enlarged section view

III-III enlarged section view

IV-IV enlarged section view

SUSCEPTOR AND EPITAXIAL GROWTH DEVICE

TECHNICAL FIELD

This disclosure relates to a susceptor for placing a wafer thereon within an epitaxial wafer growth device, and an epitaxial growth device having the susceptor.

BACKGROUND

An epitaxial wafer is formed by growing an epitaxial film on the surface of a semiconductor wafer by vapor phase growth. For example, when crystal integrity is further required, when a multi-layer structure of different resistivity is needed, or the like, an epitaxial silicon wafer is produced by growing a single crystal silicon thin film on a silicon wafer by vapor phase growth or epitaxial growth.

For epitaxial wafer production, a single wafer type epitaxial growth device (apparatus) is used for example. Here, a typical single wafer type epitaxial growth device will be described with reference to FIG. 10. As illustrated in FIG. 10, an epitaxial growth device 200 has a chamber 10 including an upper dome 11, a lower dome 12, and a dome mounting body 13, and the chamber 10 defines an epitaxial film forming chamber. The chamber 10 is provided with a gas supply opening 15 and a gas exhaust opening 16 for supplying and exhausting a reaction gas at opposing positions on the side surface thereof. Meanwhile, a susceptor 20 for placing a wafer W thereon is arranged within the chamber 10. The susceptor 20 is supported by a susceptor support shaft 50 from below. The susceptor support shaft 50 includes a main column 52, and three arms 54, including one not illustrated, radially extending from this main column 52 with an equal distance between them. Three supporting pins 58, including one not illustrated, at the tip of the arms are fitted to and support the outer circumferential part of the back surface of the susceptor 20. Moreover, three penetration holes, including one not illustrated, are formed in the susceptor 20, and a penetration hole is also formed in each of the three arms 54. Lift pins 44 are inserted through these penetration holes of the arms and the susceptor. The lower end of the lift pins 44 is supported by an ascending/descending shaft 60. When the wafer W carried into the chamber 10 is being supported, when this wafer W is being placed on the susceptor 20, and when the epitaxial wafer after vapor phase growth is carried out of the chamber 10, by the ascending/descending shaft 60 ascending and descending, the lift pins 44 ascend and descend while sliding with the penetration holes of the arms and the penetration holes of the susceptor, and ascend and descend the wafer W at the upper end thereof.

In such an epitaxial growth device, the wafer W is directly supported and lifted by the lift pins. Therefore, to a part of the back surface of the wafer W abutting against the lift pins, the lift pins ascend and abut, and contact with the upper end of the lift pins is continuously maintained. Thus, there has been a problem that scratches or pin marks occur in the above mentioned part of the back surface of the wafer W.

In response to this problem, JP H11-163102 A (PTL 1) discloses the technique of lifting a wafer directly by a part of a susceptor, instead of supporting and lifting the wafer directly by lift pins. More specifically, FIG. 5 to 8 of PLT 1 disclose a susceptor 19 constituted of a base part 21, and a placement part 20 accommodated in a central recessed part 22 provided in the center of this base part. At the time of vapor phase growth, the wafer is accommodated in a peripheral recessed part 23 formed of the base part and the placement part, and when the wafer is carried out of the chamber, the placement part 20 ascends, and lifts the wafer.

CITATION LIST

Patent Literature

PLT 1: JP H 11-163102 A

SUMMARY

Technical Problem

According to the technique of PLT 1, since the water is, when lifted, supported by a surface as a part of the susceptor, without being locally supported by lift pins, occurrence of scratches on the back surface of the wafer attributable to lift pins can be prevented. However, the inventors have newly recognized that the technique of PLT 1 has a problem as follows.

More specifically, in order to fit the placement part into the base part, generation of a gap between the placement part and the base part, in a state in which the placement part is accommodated in the base part, at the time of vapor phase growth, cannot be avoided. While heat is transmitted from a heated susceptor to a wafer at the time of vapor phase growth, heat from the susceptor is less likely to be transmitted to a wafer part immediately above this gap part as compared to other parts of the wafer, and as a result, the growth rate of an epitaxial film also becomes slow. Thus, the gap generated between the placement part and the base part makes the in-surface temperature distribution of the wafer uneven at the time of vapor phase growth, and as a result, makes the in-surface film thickness distribution of the epitaxial film grown by vapor phase growth uneven. Since a high level of evenness of the in-surface film thickness distribution of epitaxial films has been demanded for epitaxial wafers in recent years, it is necessary to make the in-surface temperature distribution of wafers at the time of vapor phase growth more even.

Therefore, in consideration of the above problem, this disclosure has the purpose of providing a susceptor and an epitaxial growth device, capable of preventing occurrence of scratches on the back surface of a wafer attributable to lift pins and reducing unevenness of the in-surface temperature distribution of the wafer.

Solution to Problem

The brief configuration of this disclosure for solving the above problem is as follows.

1. A susceptor for placing a wafer thereon within an epitaxial growth device, wherein a counterbore part for placing the wafer thereon is formed on a front surface of the susceptor, the susceptor has a susceptor main body, and a plate-shaped member placed on a recessed part provided in a central part of a front surface of the susceptor main body, a bottom surface of the counterbore part is constituted of a front surface of the plate-shaped member, and a part of the front surface of the susceptor main body, located around the recessed part, the susceptor main body is provided with penetration holes, for lift pins that support a back surface of the plate-shaped member, and ascend and descend the plate-shaped member, to be inserted therethrough, when the wafer is being placed on the counterbore part and when the wafer is carried out of the counterbore part, the front surface of the plate-shaped member ascended by the lift pins acts as a supporting surface for supporting at least a central part of a back surface of the wafer by surface contact, and a separation space between the plate-shaped member and the to susceptor main body, in a state in which the plate-shaped member is placed on the recessed part, enters further into a central side of the plate-shaped member, in a direction from the front surface to the back surface of the susceptor.

2. The susceptor according to the above item 1, wherein a periphery of the plate-shaped member and a periphery of the recessed part of the susceptor main body each has an inclined surface that enters further into the central side of the plate-shaped member in a direction from the front surface to the back surface of the susceptor.

3. The susceptor according to the above item 1, wherein a periphery of the recessed part of the susceptor main body has a stepped part, the plate-shaped member has a first part with a first radius r1, and a second part with a second radius r2 that is larger than r1 on the first part, and the stepped part supports a periphery of the second part.

4. The susceptor according to any one of the above items 1 to 3, wherein the lift pins are fixed to the plate-shaped member.

5. An epitaxial growth device comprising the susceptor according to any one of the above items 1 to 4, and an ascending/descending mechanism for ascending and descending the lift pins by supporting the lower end of the lift pins.

Advantageous Effect

The susceptor and the epitaxial growth device according to this disclosure can prevent occurrence of scratches on the back surface of a wafer attributable to lift pins and reduce unevenness of the in-surface temperature distribution of the wafer.

BRIEF DESCRIPTION OF THE DRAWINGS

This disclosure will be further described with reference to the accompanying drawings, in which:

FIG. 1A illustrates a state of having no wafer placed thereon, FIG. 1B illustrates a state of having the wafer W placed on the counterbore part 21 of FIG. 1A, and FIG. 1C illustrates a state of having the wafer W lifted by a plate-shaped member 40;

DETAILED DESCRIPTION

Figure 8:
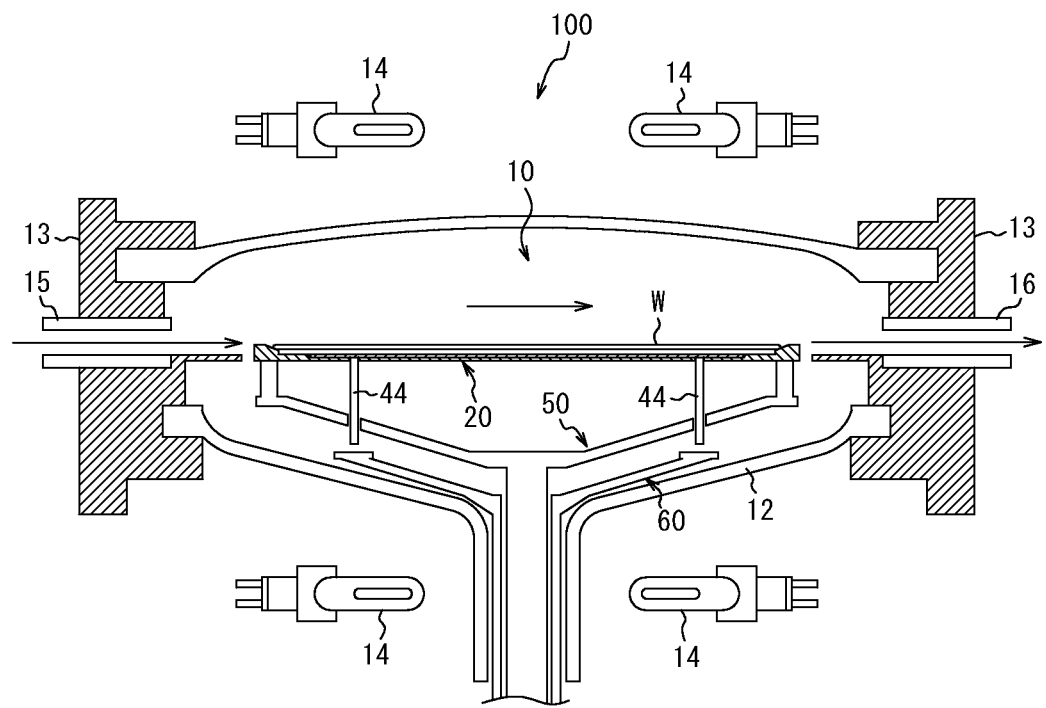
FIG. 8 is a schematic view of an epitaxial growth device 100 according to one embodiment of this disclosure, illustrating a state of having the wafer W placed on the susceptor, at the time of vapor phase growth.
Figure 9:
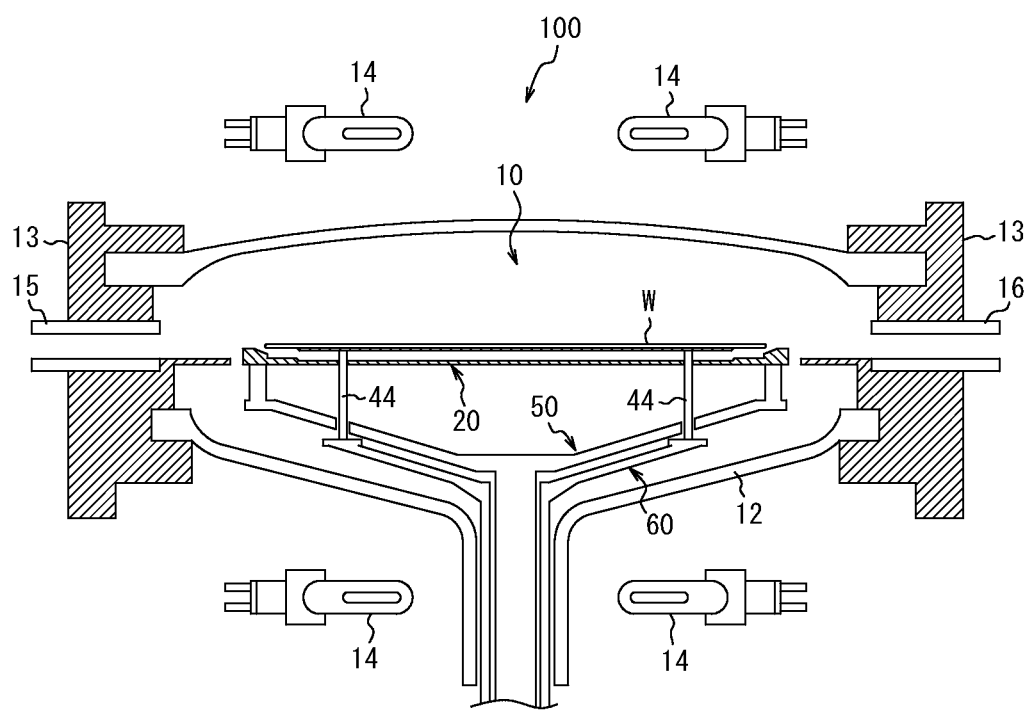
FIG. 9 is a schematic view of the epitaxial growth device 100 according to one embodiment of this disclosure, illustrating a state of having the wafer W lifted by the plate-shaped member 40.
Figure 10:
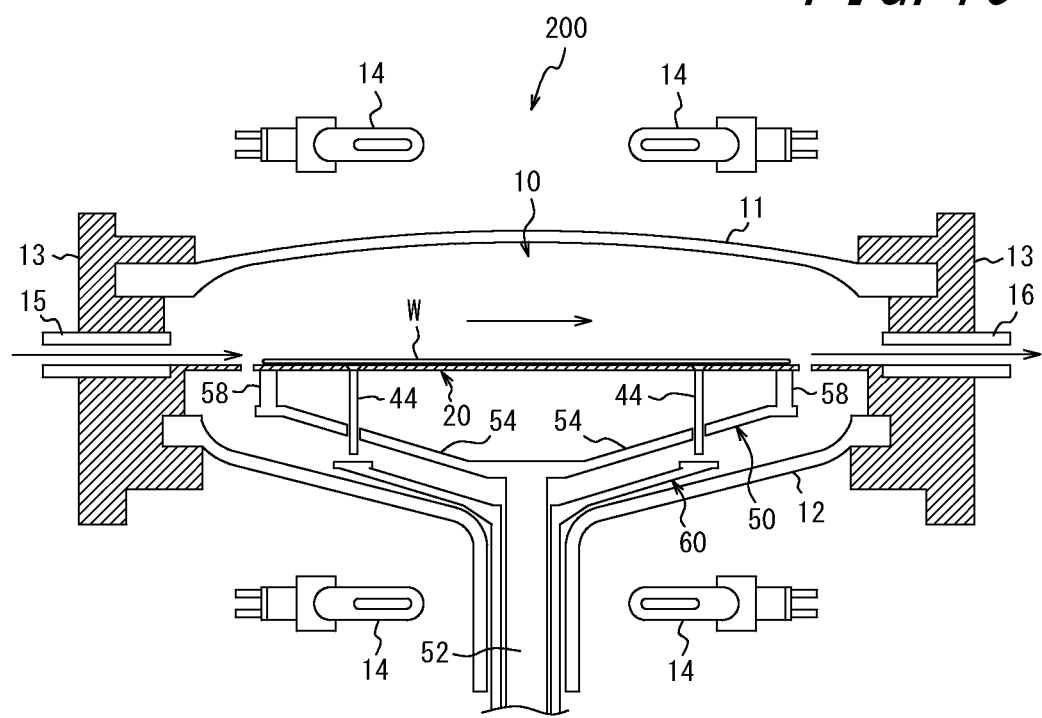
FIG. 10 is a schematic view of the conventional epitaxial growth device 200, illustrating a state of having the lift pins 44 descended with respect to the susceptor 20, at the time of vapor phase growth.

With reference to FIG. 8 and FIG. 9, the epitaxial growth device 100 according to one embodiment of this disclosure will be described. Moreover, with reference to FIG. 1 to 3, the susceptor 20 according to one embodiment of this disclosure, which is included in this epitaxial growth device 100, will be described.

Epitaxial Growth Device

Figure 7A:
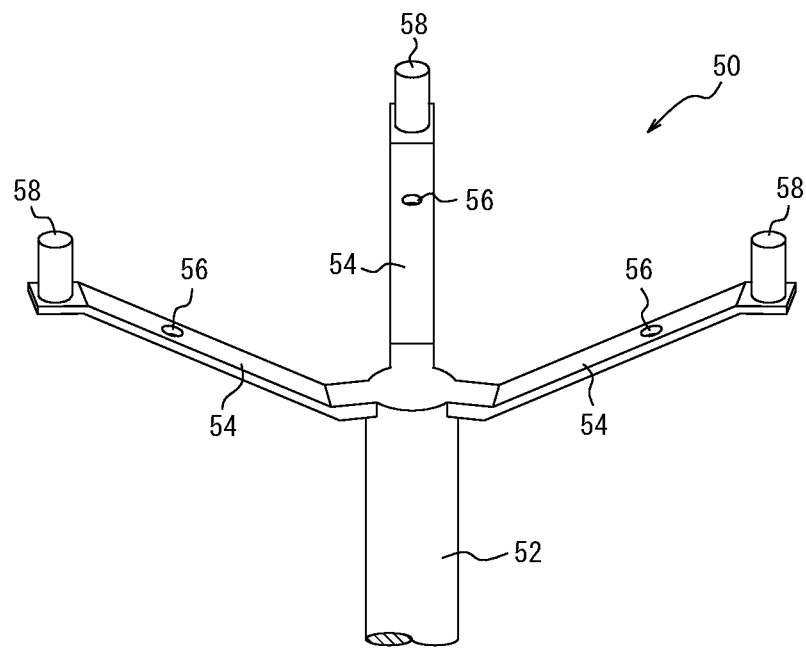
FIG. 7A is an exploded perspective view of the susceptor support shaft 50.
Figure 7B:
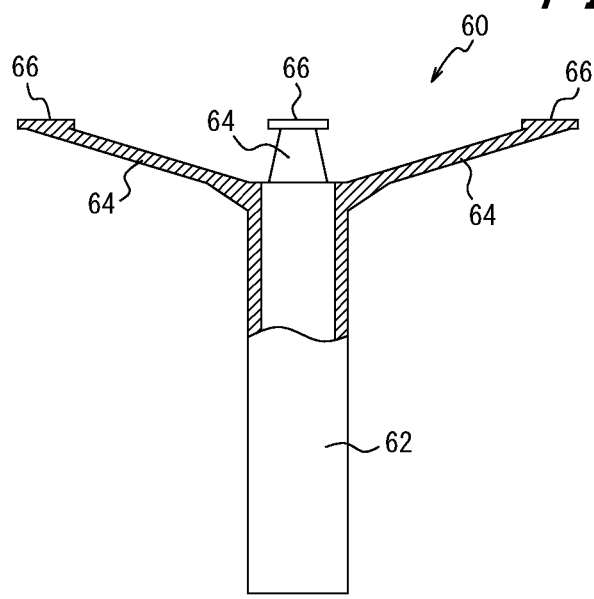
FIG. 7B is an exploded perspective view of the ascending/descending shaft 60.

The epitaxial growth device 100 illustrated in FIG. 8 and FIG. 9 has the chamber 10, a heat lamp 14, the susceptor 20 also illustrated in FIG. 1 and FIG. 2, the susceptor support shaft 50 also illustrated in FIG. 7A, and the ascending/descending shaft 60 also illustrated in FIG. 7B.

Chamber

The chamber 10 includes the upper dome 11, the lower dome 12, and the dome mounting body 13, and this chamber 10 defines the epitaxial film forming chamber. The chamber 10 is provided with the gas supply opening 15 and the gas exhaust opening 16 for supplying and exhausting a reaction gas at opposing positions on the side surface thereof.

Heat Lamp

The heat lamp 14 is arranged in the upper side region and the lower side region of the chamber 10, and generally a halogen lamp or infrared lamp having a high temperature increase/decrease rate, and excellent temperature controllability is used.

Main Configuration of Susceptor

Figure 1A:
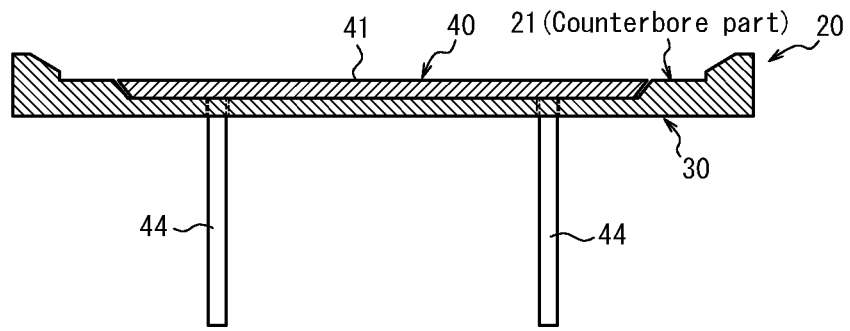
FIGS. 1A, 1B and 1C are schematic views of the susceptor 20 according to one embodiment of this disclosure, where
Figure 1B:
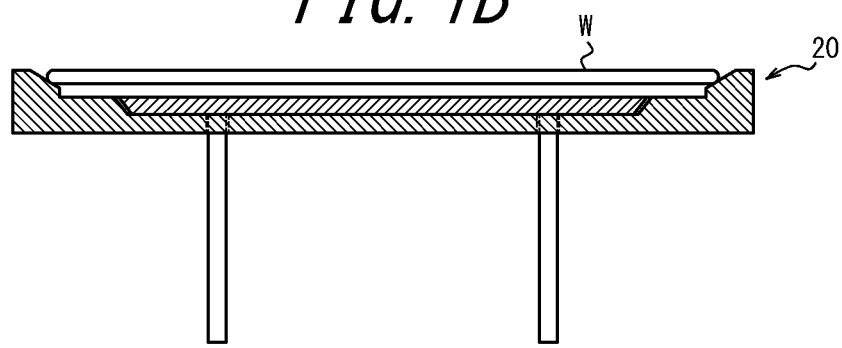

With reference to FIG. 1 and FIG. 2, the main configuration of the susceptor 20 will be described. The susceptor 20 is a disc-shaped member for placing the wafer W thereon inside the chamber 10. For the susceptor 20, carbon graphite or graphite as a base material having the surface thereof coated with silicon carbide can be used. With reference to FIGS. 1A and 1B, the counterbore part 21 for placing the wafer W thereon is formed in the front surface of the susceptor 20. The diameter of the counterbore part 21 at the opening end may be set accordingly in consideration of the diameter of the wafer W, and normally is about 1.0 to 2.0 mm larger than the diameter of the wafer W.

Figure 1C:
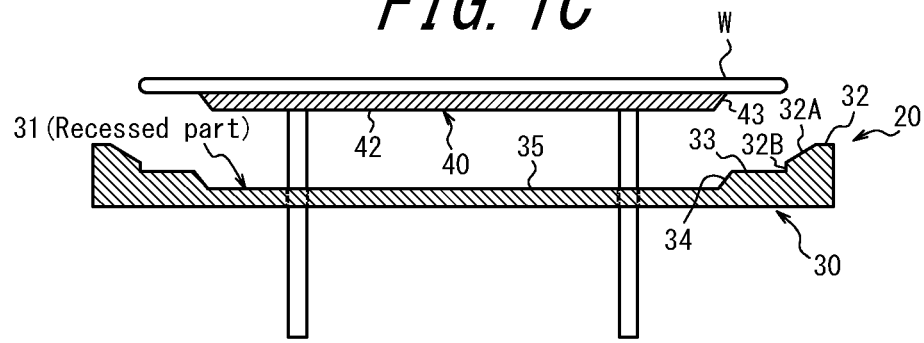
Figure 2A:
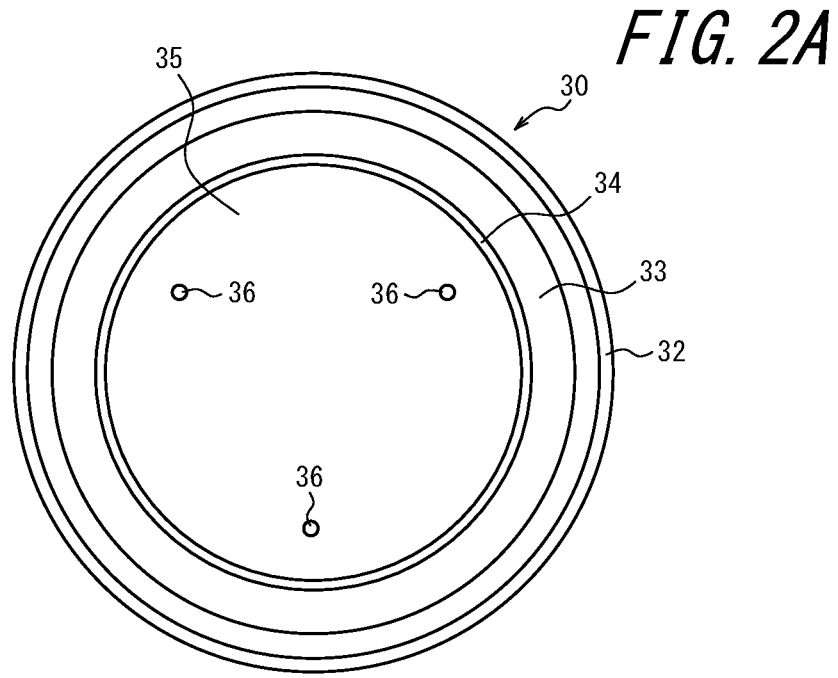
FIG. 2A is a top view of a susceptor main body 30 in the susceptor 20 of FIG. 1.

With reference to FIG. 1A to 1C, the susceptor 20 has the susceptor main body 30, and the plate-shaped member 40 placed on a recessed part 31 provided in the central part of the front surface of this susceptor main body.

With reference to FIG. 1A to 1C and FIG. 2A, the front surface of the susceptor main body 30 includes a front surface outermost circumferential part 32, a wafer supporting surface 32A, a vertical wall surface 32B, a front surface middle part 33, an inclined surface 34, and a front surface central part 35. The front surface outermost circumferential part 32 is located around the counterbore part 21 illustrated in FIG. 1A. The wafer supporting surface 32A is an inclined surface located inside the front surface outermost circumferential part 32, supporting the back surface periphery of the wafer W by line contact, and constituting a part of the counterbore part. The vertical wall surface 32B is a wall surface continuous from the inner circumferential end of the wafer supporting surface 32A, and constituting a part of the counterbore part. The front surface middle part 33 is continuous from the vertical wall surface 32B, and constitutes a part of the bottom surface of the counterbore part 21. The front surface central part 35 is located inside the front surface middle part 33, and constitutes the bottom surface of the recessed part 31. The inclined surface 34 is a characteristic part of this embodiment described below, and is located between the front surface middle part 33 and the front surface central part 35. The susceptor main body 30 is provided with three penetration holes 36 concentrically located with an equal angle of 120 degrees, and penetrating the front surface central part 35 and the back surface in the vertical direction. The lift pins 44 described below are inserted through the three penetration holes 36.

With reference to FIG. 1A to 1C and FIG. 2B, the plate-shaped member 40 is a disc-shaped member that has a front surface 41 and a back surface 42, and that is placed on the recessed part 31 with a necessary minimum gap or clearance. As illustrated in FIG. 1A, the front surface 41 constitutes a part of the bottom surface of the counterbore part 21, and the back surface 42 is in contact with and supported by the front surface central part 35, or the bottom surface of the recessed part, of the susceptor main body. The periphery connecting the front surface 41 and the back surface 42 is an inclined surface 43, which is a characteristic part of this embodiment described below. Three lift pins 44 extend from the back surface 42. The three lift pins 44 are respectively inserted through the three penetration holes 36 provided in the susceptor main body. The lift pins 44 can attach and detach the plate-shaped member 40 and the susceptor main body 30, while supporting the back surface 42 of the plate-shaped member, by being ascended and descended in the vertical direction by the ascending/descending shaft 60 described below. This motion will be described below. The lift pins 44 are preferably located in a region separate from the center of the back surface 42 of the plate-shaped member by not less than 50% of the radius of the back surface. Although the lift pins 44 are fixed to the plate-shaped member 40 in this embodiment, the lift pins 44 may not be fixed to the plate-shaped member 40.

As illustrated in FIGS. 1A and 1B, the bottom surface of the counterbore part 21 is constituted of the front surface 41 of the plate-shaped member, and a part of the front surface of the susceptor main body, specifically the front surface middle part 33, located around the recessed part 31. More specifically, in a state in which the plate-shaped member 40 is placed on the recessed part 31, and the wafer W is placed on the counterbore part 21, among the surfaces of the counterbore part 21, the front surface 41 of the plate-shaped member, and the front surface meddle part 33 of the susceptor main body are separate from and opposite to the back surface of the wafer W.

Meanwhile, as illustrated in FIG. 1C, when the wafer W is being placed on the counterbore part 21, and when the wafer W is carried out of the counterbore part 21, i.e., the wafer W is conveyed, the susceptor main body 30 and the plate-shaped member 40 are separate in the vertical direction, and the front surface 41 of the plate-shaped member ascended by the lift pins 44 acts as a supporting surface for supporting at least the central part of the back surface of the wafer W by surface contact. Therefore, occurrence of scratches on the back surface of the wafer W attributable to the lift pins can be prevented.

Here in the specification, "the central part of the back surface of the wafer" means a region separate from the wafer center by not more than 50% of the wafer radius in the back surface of the wafer. More specifically, in this embodiment, from the front surface view of the susceptor main body 30, the center of the counterhore part 21 and the center of the recessed part 31 match, i.e., the recessed part 31 is not decentered from the counterhore part 21. Moreover, the radius of the front surface 41 of the plate-shaped member is not less than 50% of the wafer radius.

Meanwhile, the radius of the front surface 41 of the plate-shaped member is preferably not more than 90% of the wafer radius. The wafer W supported by the plate-shaped member 40 is conveyed out of the chamber, while the back surface outer circumferential part of the wafer W is supported by a wafer supporting part 72 of a U-shaped conveying blade 70 inserted from the direction illustrated in FIG. 2B. When the radius of the front surface 41 is more than 90% of the wafer radius, it is difficult to support the wafer W by the conveying blade 70.

The surface part of the plate-shaped member 40 or the entirety of the plate-shaped member 40 is preferably made of a soft material such as glassy carbon. It is because occurrence of scratches when the back surface of the wafer W is supported by surface contact can be prevented.

In addition, the bottom of the recessed part 31 of the susceptor main body and the plate-shaped member 40 are also preferably porous structures. It is because by promoting hydrogen gas to sneak into the back surface of the wafer W, occurrence of halo or haze on the wafer back surface can be prevented.

Susceptor Support Shaft

With reference to FIG. 7A, the susceptor support shaft 50 supports the susceptor 20 from below within the chamber 10, and has the main column 52, the three arms 54, and the three supporting pins 58. The main column 52 is arranged on substantially the same axis as the center of the susceptor. The three arms 54 radially extend below the periphery of the susceptor 20 from the main column 52, and respectively have penetration holes 56 penetrating in the vertical direction. Additionally in the specification, "the periphery of the susceptor" means a region outside the susceptor center by not less than 80% of the susceptor radius. The supporting pins 58 are respectively provided in the tip of the three arms 54, and directly support the susceptor 20. More specifically, the supporting pins 58 support the back surface periphery of the susceptor. The three lift pins 44 are respectively inserted through the three penetration holes 56. The susceptor support shaft 50 is desirable to be constituted of quartz, and is desirable to be constituted particularly of synthetic quartz. However, the tip part of the supporting pins 58 is preferable to be constituted of silicon carbide, which is the same as the susceptor 20.

Ascending/Decending Shaft

As illustrated in FIG. 7B, the ascending/descending shaft 60 as an ascending/descending mechanism has a main column 62 defining a hollow for accommodating the main column 52 of the susceptor support shaft and having a shared rotation axis with this main column 52, and three support columns 64 branching from the tip of this main column 62. The tip parts 66 of these support columns 64 supports the lower end of the lift pins 44 respectively. The ascending/descending shaft 60 is preferably constituted of quartz. By the ascending/descending shaft 60 moving up and down along the main column 52 of the susceptor support shaft in the vertical direction, the lift pins 44 can be ascended and descended.

Production Procedure for Epitaxial Wafer

Next, a series of actions of carrying the wafer W into the chamber 10, vapor phase growth of an epitaxial film onto the wafer W, and carrying the produced epitaxial wafer out of the chamber 10 will be described with appropriate reference to FIG. 8 and FIG. 9.

Figure 2B:
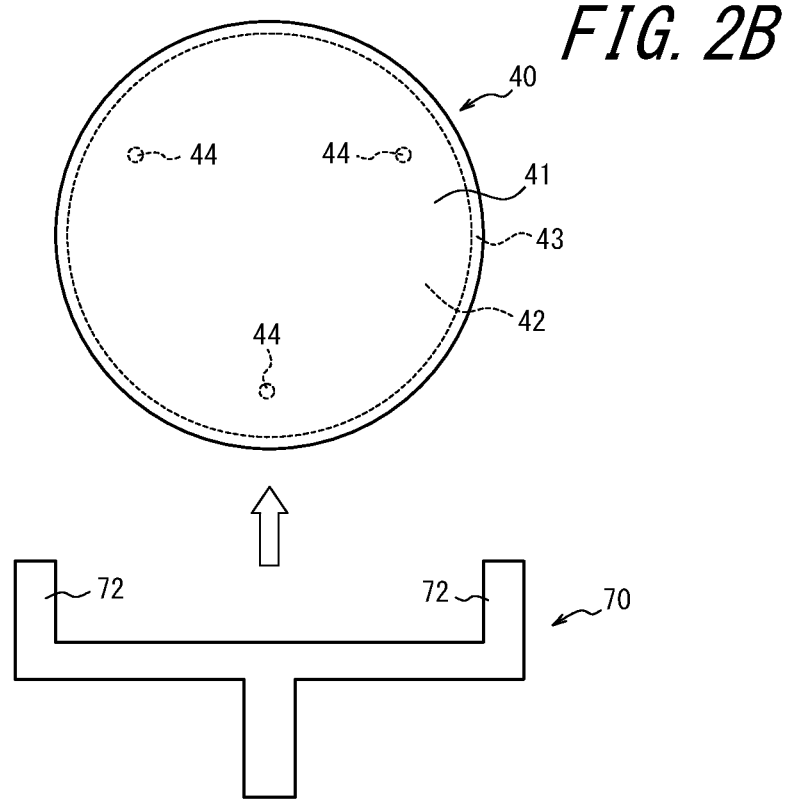
FIG. 2B is a top view of the plate-shaped member 40 in the susceptor 20 of FIG. 1.

The wafer W carried into the chamber 10 while being supported by the conveying blade 70 illustrated in FIG. 2B is temporarily placed on the front surface 41 of the plate-shaped member 40 lifted by the lift pins 44. The ascending movement of the lift pins 44 is performed through the ascending movement of the ascending/descending shaft 60 supporting their lower end.

Then, by ascending the susceptor support shaft 50, the susceptor main body 30 is moved to a position of the plate-shaped member 40, and the wafer W is placed on the counterbore part 21 of the susceptor 20. Subsequently, an epitaxial wafer is produced by, while heating the wafer W to a temperature not lower than 1000° C. by the heat lamp 14, supplying a reaction gas from the gas supply opening 15 into the chamber 10, and growing an epitaxial film having a predetermined thickness by vapor phase growth. During vapor phase growth, by rotating the susceptor support shaft 50 using the main column 52 as a rotation axis, the susceptor 20 and the wafer W thereon are rotated.

Thereafter, by descending the susceptor support shaft 50, the susceptor main body 30 is descended. This descending is performed until the lift pins 44 are supported by the ascending/descending shaft 60 and the plate-shaped member 40 is separate from the susceptor main body 30, and the produced epitaxial wafer is supported by the front surface 41 of the plate-shaped member 40 supported by the lift pins 44. Then, the conveying blade 70 is introduced into the chamber 10, and the epitaxial wafer is placed on the wafer supporting part 72 of the conveying blade by descending the lift pins 44. Thus, the epitaxial wafer is passed from the plate-shaped member 40 to the conveying blade 70. Subsequently, the epitaxial wafer is carried out of the chamber 10 along with the conveying blade 70.

Configuration of Characteristic Part of Susceptor

Here, separation between the susceptor main body 30 and the plate-shaped member 40, as a characteristic configuration of this disclosure, will be described in detail.

Figure 3A:
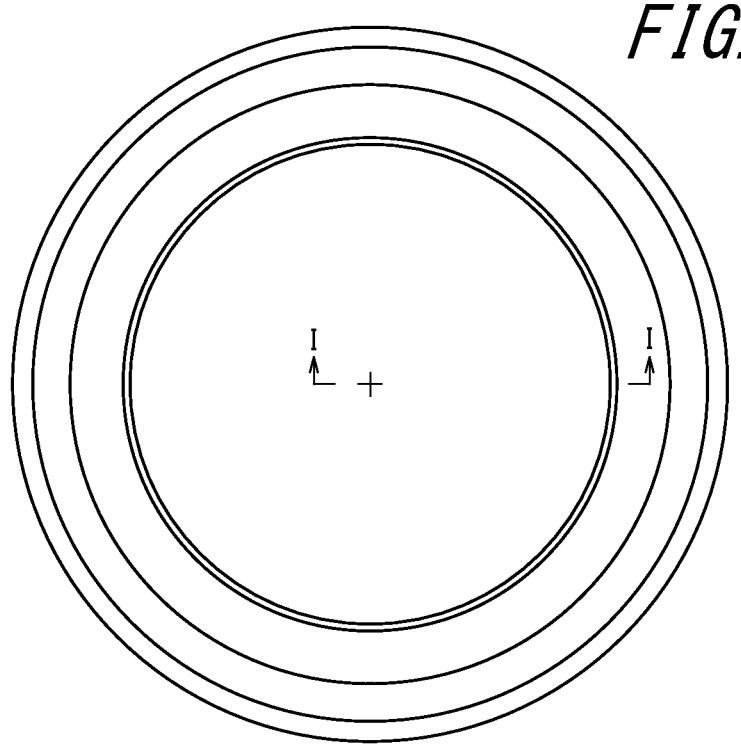
FIG. 3A is a top view of the susceptor 20 of FIG. 1, in a state of having the plate-shaped member placed on the recessed part of the susceptor main body.
Figure 3B:
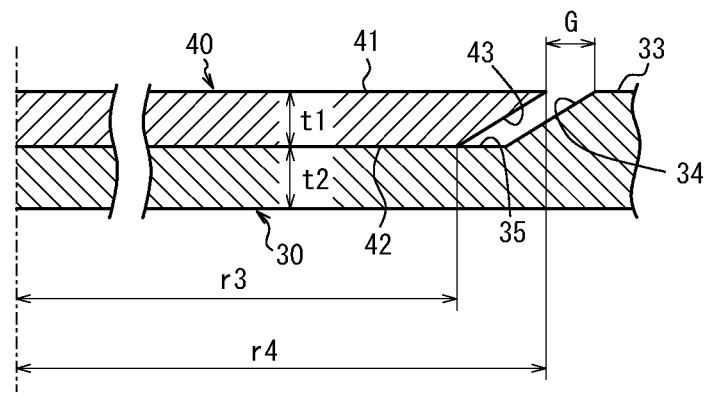
FIG. 3B is a I-I section view of FIG. 3A.

With reference to FIGS. 3A and 3B, in the susceptor 20 of this embodiment, the periphery of the plate-shaped member 40 has the inclined surface 43 that enters further into the central side of the plate-shaped member, in a direction from the front surface to the back surface of the susceptor, i.e., downward vertical direction, and the periphery of the recessed part of the susceptor main body 30 also has the inclined surface 34 that enters further into the central side of the plate-shaped member in a direction from the front surface to the back surface of the susceptor. Therefore, a separation space between the plate-shaped member 40 and the susceptor main body 30, or a position of the separation part between the plate-shaped member 40 and the susceptor main body 30 in the horizontal direction, in a state in which the plate-shaped member 40 is placed on the recessed part, enters further into the central side of the plate-shaped member in a direction from the front surface to the back surface of the susceptor, i.e., downward vertical direction.

Figure 6A:
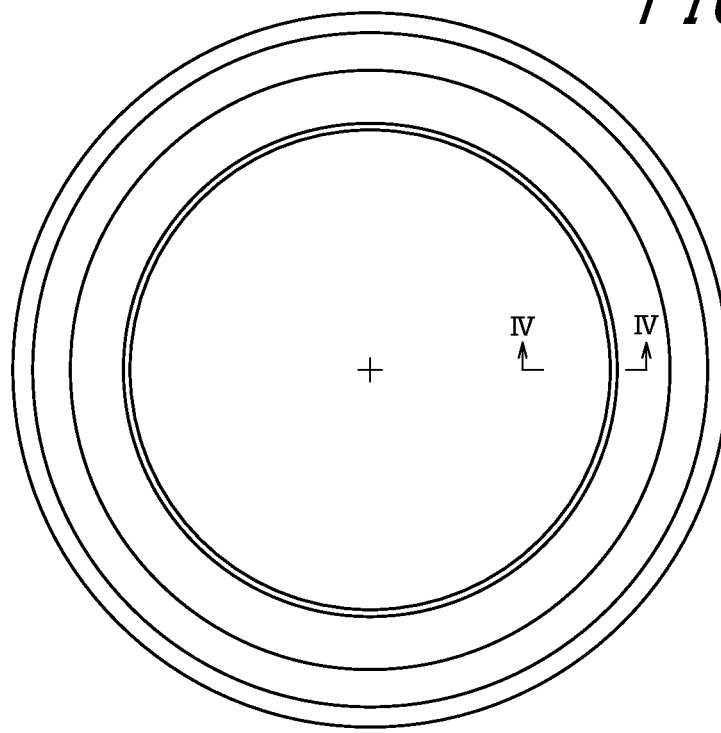
FIG. 6A is a top view of a susceptor according to Comparative Example, in a state of having the plate-shaped member placed on the recessed part of the susceptor main body.
Figure 6B:
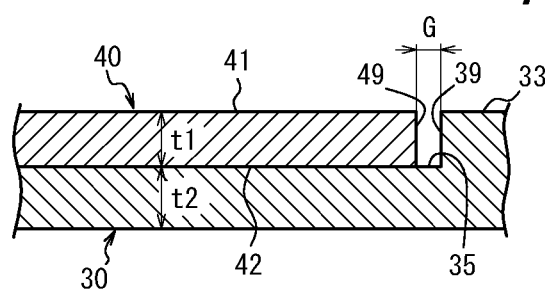
FIG. 6B is a IV-IV section view of FIG. 6A.

Technical significance of adopting such a configuration will be described with comparison to FIGS. 6A and 6B illustrating Comparative Example. In FIG. 6, the periphery of the plate-shaped member 40 is a vertical surface 49, and the periphery of the recessed part of the susceptor main body 30 is also a vertical surface 39. Therefore, the separation space between the plate-shaped member 40 and the susceptor main body 30 extends straight in the vertical direction, and the above mentioned separation space or gap is present in a large size immediately below the wafer W. This gap makes the in-surface temperature distribution of the wafer W uneven at the time of vapor phase growth, even when it is a minimum distance, e.g., about 0.5 to 1.0 mm, necessary for accommodating the plate-shaped member 40 in the recessed part 31, and as a result, makes the in-surface film thickness distribution of the epitaxial film grown by vapor phase growth uneven.

Contrarily, in this embodiment illustrated in FIG. 3, the separation space between the plate-shaped member 40 and the susceptor main body 30 enters further into the central side of the plate-shaped member, in the downward vertical direction. Therefore, the size of the gap located immediately below the wafer W can be made smaller as compared to FIG. 6, and as a result, unevenness of the in-surface temperature distribution of the wafer W can be reduced.

Additionally, FIG. 3A illustrates a state in which the plate-shaped member 40 is placed on the susceptor main body 30 without being decentered with respect thereto, i.e., the distance of the gap between the plate-shaped member 40 and the susceptor main body 30 is constant in the circumferential direction, and FIG. 3B is a vertical section view or I-I section view including the susceptor center in that state. It is also similar for FIG. 6, and FIGS. 4 and 5 described below.

Here, a thickness t1 of the plate-shaped member 40 is preferably not less than 0.5 mm to not more than 3.0 mm. It is because, although the thickness t1 is preferably smaller from the perspective of making the size of the gap located immediately below the wafer W small, there is a possibility that less than 0.5 mm lacks the strength. Moreover, it is because, when the thickness t1 is more than 3.0 mm, it becomes difficult to obtain the strength of the susceptor main body 30.

With reference to FIG. 3B, a radius r4 of the front surface 41 of the plate-shaped member is, as mentioned previously, preferable to be not less than 50% and not more than 90% of the wafer radius. Moreover, a radius r3 of the back surface 42 of the plate-shaped member is preferable to be about 1.0 to 5.0 mm smaller than r4.

The inclined surface 43 and the inclined surface 34 are preferable to have an equal inclination angle, and the inclination angle with respect to the vertical direction is preferable to be 30 to 45 degrees.

The shape of the periphery of the plate-shaped member 40 and the shape of the periphery of the recessed part of the susceptor main body 30 are not limited to the shape illustrated in FIG. 3B, and the effect of this disclosure can be obtained by designing the separation space between the plate-shaped member 40 and the susceptor main body 30 to enter further into the central side of the plate-shaped member in the downward vertical direction.

Figure 4A:
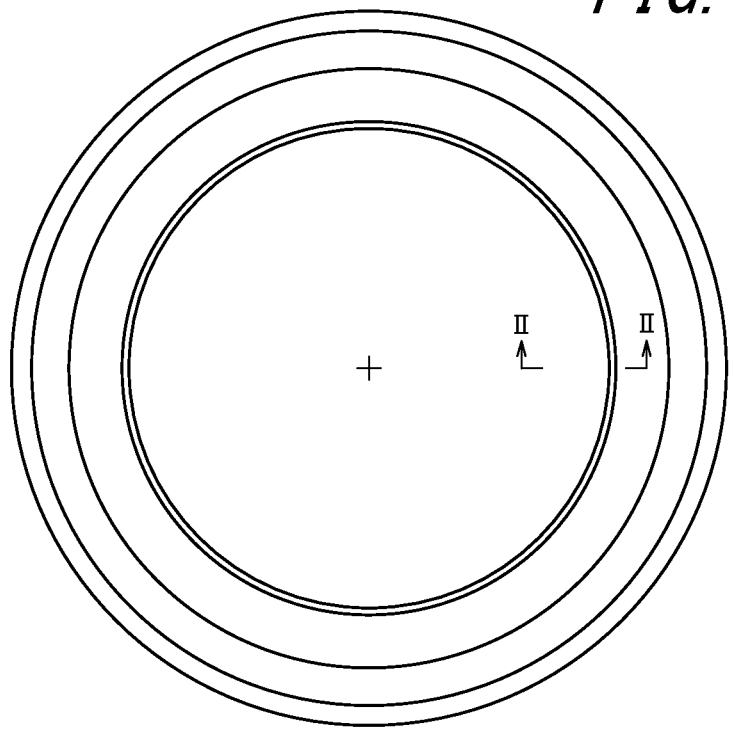
FIG. 4A is a top view of a susceptor according to another embodiment of this disclosure, in a state of having the plate-shaped member placed on the recessed part of the susceptor main body.
Figure 4B:
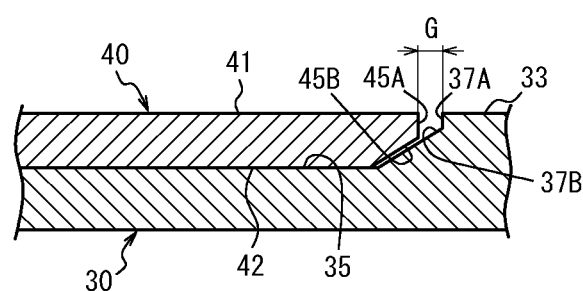
FIG. 4B is a II-II section view of FIG. 4A.

Another embodiment is illustrated in FIGS. 4A and 4B. In this embodiment, the periphery of the plate-shaped member 40 has a vertical surface 45A that is continuous from the front surface 41, and an inclined surface 45B that is continuous from this vertical surface 45A and enters further into the central side of the plate-shaped member in the downward vertical direction. The periphery of the recessed part of the susceptor main body 30 also has a vertical surface 37A that is continuous from the front surface middle part 33, and an inclined surface 37B that is continuous from this vertical surface 37A and enters further into the central side of the plate-shaped member in the downward vertical direction. Also in this case, the size of the gap located immediately below the wafer W can be made smaller as compared to FIG. 6, and as a result, unevenness of the in-surface temperature distribution of the wafer W can be reduced. Additionally, while there is a possibility that the strength is not sufficient due to the tip of the plate-shaped member 40 tapering to a point in the case of FIG. 3B, the strength is not lost in the case of FIG. 4B.

The vertical surface 45A and the vertical surface 37A are preferable to have a height that is 20 to 50% of the thickness t1 of the plate-shaped member 40. When it is less than 20%, there is a possibility that the strength is not sufficient, and when it is more than 50%, there is a possibility that the effect of reducing unevenness of the in-surface temperature distribution of the wafer W is not sufficient.

The inclined surface 45B and the inclined surface 37B are preferable to have an equal inclination angle, and the inclination angle with respect to the vertical direction is preferable to be 30 to 45 degrees similarly to FIG. 3B.

Figure 5A:
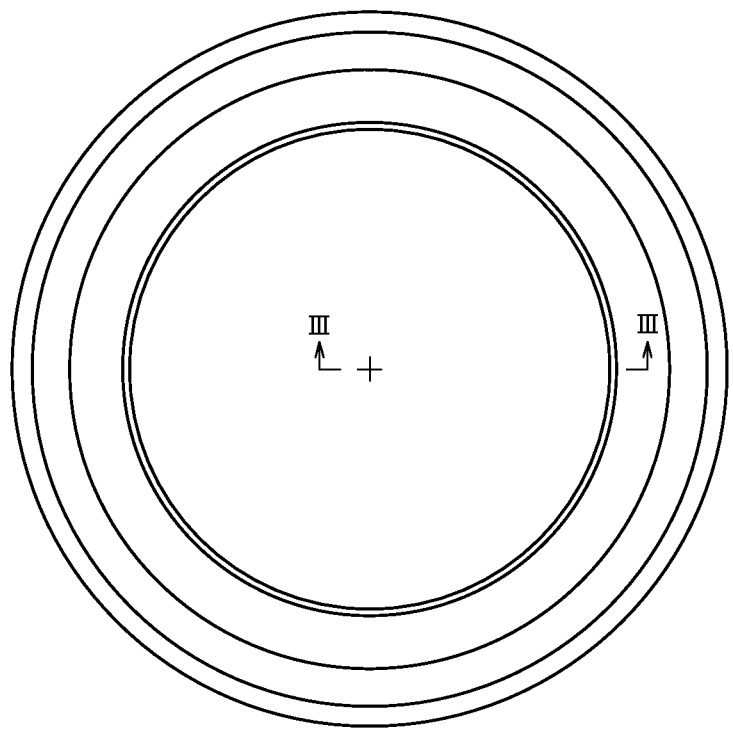
FIG. 5A is a top view of a susceptor according to yet another embodiment of this disclosure, in a state of having the plate-shaped member placed on the recessed part of the susceptor main body.
Figure 5B:
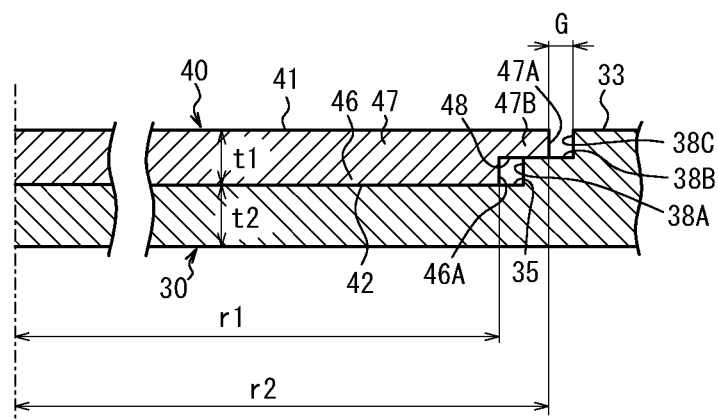
FIG. 5B is a III-III section view of FIG. 5A.

Yet another embodiment is illustrated in FIGS. 5A and 5B. In this embodiment, the periphery of the recessed part of the susceptor main body 30 has a stepped part formed of a first vertical surface 38A that is continuous from the front surface central part 35, a horizontal surface 38B that is continuous from this first vertical surface 38A, and a second vertical surface 38C that is continuous from this horizontal surface 38B to the front surface middle part 33. Meanwhile, the plate-shaped member 40 has a first part 46 of a first radius r1, and a second part 47 of a second radius r2 that is larger than r1 on this first part. More specifically, the periphery of the plate-shaped member 40 is composed of a first vertical surface 46A that is the outer circumference of the first part, a second vertical surface 47A that is the outer circumference of the second part, and a horizontal surface 48 that is located between them. Moreover, the stepped part supports a second part periphery 47B. In other words, the horizontal surface 48 and the horizontal surface 38B are in contact with each other.

Also in this embodiment, since the separation space between the plate-shaped member 40 and the susceptor main body 30 gradually enters further into the central side of the plate-shaped member in the downward vertical direction, the size of the gap located immediately below the wafer W can be made smaller as compared to FIG. 6, and as a result, unevenness of the in-surface temperature distribution of the wafer W can be reduced.

The second vertical surface 47A of the plate-shaped member and the second vertical surface 38C of the susceptor main body are preferable to have the same height, which can be about 20 to 50% of the thickness t1 of the plate-shaped member 40. Additionally, the first vertical surface 46A of the plate-shaped member and the first vertical surface 38A of the susceptor main body are also preferable to have the same height.

The radius r2 of the second part, i.e., the radius of the front surface 41 of the plate-shaped member is, as mentioned previously, preferable to be not less than 50% and not more than 90% of the wafer radius. Moreover, the radius r1 of the first part, i.e., the radius of the back surface 42 of the plate-shaped member is preferable to be about 1.0 to 5.0 mm smaller than r2. The width of the stepped part or the horizontal surface 38B is preferably equal to r2−r1.

EXAMPLES

Example 1

Using the susceptor illustrated in FIGS. 1 to 3 and the epitaxial growth device illustrated in FIGS. 8 and 9, an epitaxial silicon wafer was produced by following the procedure described above. In FIG. 3B, the radius r3 was 120 mm, the radius r4 was 123 mm, the thickness t1 was 2.0 mm, the thickness t2 was 2.3 mm, and the gap distance G was 1.0 mm. As a substrate for the epitaxial wafer, a boron doped silicon wafer having a diameter of 300 mm was used.

Example 2

Similarly to Example 1 except for using the susceptor illustrated in FIG. 5, an epitaxial silicon wafer was produced. In FIG. 5B, the radius r1 was 121 mm, the radius r2 was 123 mm, the thickness t1 was 2.0 mm, the thickness t2 was 2.3 mm, and the gap distance G was 1.0 mm.

Comparative Example

Similarly to Example 1 except for using the susceptor illustrated in FIG. 6, an epitaxial silicon wafer was produced. In FIG. 6B, the thickness t1 was 2.0 mm, the thickness t2 was 2.3 mm, and the gap distance G was 1.0 mm. The radius of the plate-shaped member was 120 mm.

Vapor Phase Growth Conditions

For producing epitaxial wafers, a silicon wafer was introduced into the chamber, and placed on the susceptor in the previously described method. Then, a hydrogen bake out was performed under a hydrogen gas atmosphere at 1150° C., and a silicon epitaxial film was grown on the silicon wafer surface by 4 µm at 1150° C., to obtain an epitaxial silicon wafer. Here, trichlorosilane gas was used as a raw material source gas, diborane gas as a dopant gas, and hydrogen gas as a carrier gas. Subsequently, by the previously described method, the epitaxial silicon wafer was carried out of the chamber.

Evaluation of Back Surface Quality

The epitaxial wafers produced in Examples and Comparative Example were subject to observation of the back surface region corresponding to the position of lift pins using a surface examination device, manufactured by KLA-Tencor: Surfscan SP-2, in DCO mode, and measurement of the area having a scattering strength not lower than the value set for laser reflection, or pin mark strength, to evaluate scratches on the epitaxial wafer back surface attributable to lift pins. The result was 0 mm$^2$, and no scratch attributable to lift pins was observed on the epitaxial wafer back surface for both Comparative Example, and Examples 1 and 2.

Evaluation of In-Surface Temperature Distribution of Wafer

The epitaxial wafers produced in Examples and Comparative Example were subject to measurement of the haze level using a surface examination device, manufactured by KLA-Tencor: Surfscan SP-2. As the haze level is known to be proportional to the temperature within the wafer surface, the temperature distribution within the wafer surface was calculated from this value, and compared. The result is illustrated in FIG. 11.

Figure 11A:
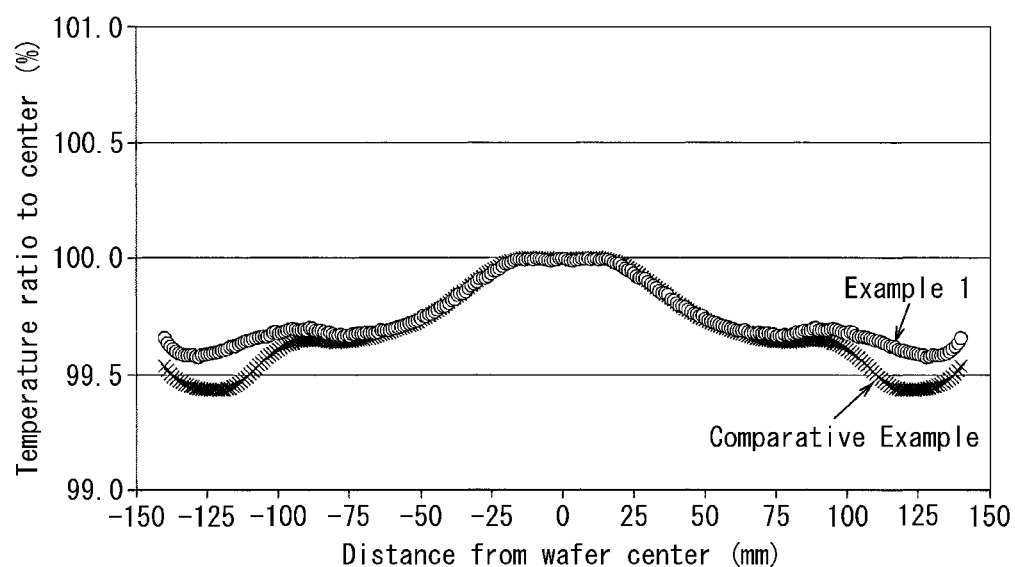
FIG. 11A is a graph illustrating the in-surface temperature distribution of the wafer for comparison between Comparative Example and Example 1.
Figure 11B:
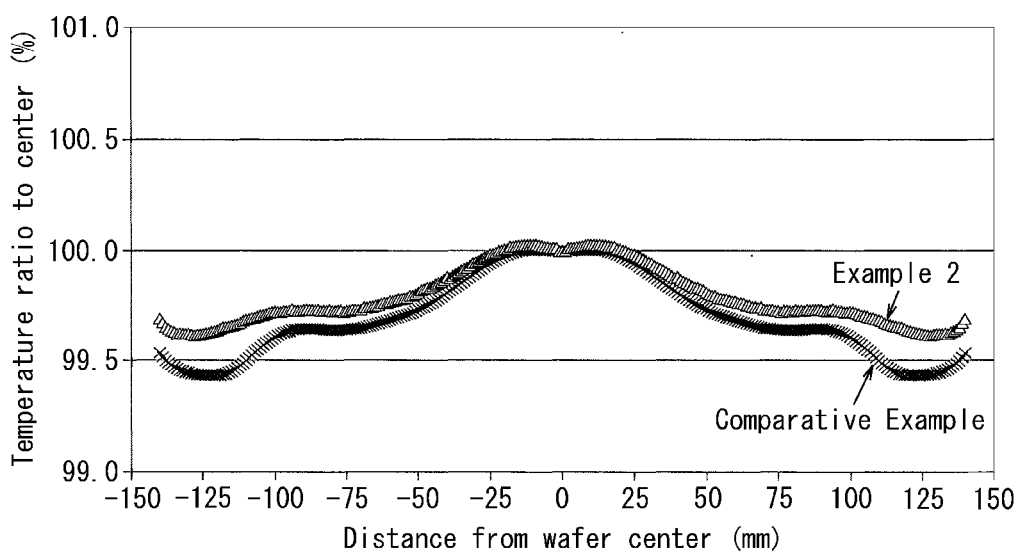
FIG. 11B is for comparison between Comparative Example and Example 2.

As illustrated in FIGS. 11A and 11B, the temperature of the wafer is lower in the outer circumference of the wafer having the gap between the plate-shaped member and the susceptor main body located immediately below, or around the position separate from the wafer center by 120 mm, and the in-surface temperature distribution of the wafer is uneven in Comparative Example. On the contrary, a temperature decrease in the outer circumference of the wafer is prevented, and unevenness of the in-surface temperature distribution of the wafer is reduced in Examples 1 and 2.

INDUSTRIAL APPLICABILITY

The susceptor and the epitaxial growth device according to this disclosure, which can prevent occurrence of scratches on the wafer back surface attributable to lift pins, and reduce unevenness of the in-surface temperature distribution of the wafer, can preferably be applied to epitaxial wafer production.

REFERENCE SIGNS LIST

100 Epitaxial growth device
10 Chamber
11 Upper dome
12 Lower dome
13 Dome mounting body
14 Heat lamp
15 Gas supply opening
16 Gas exhaust opening
20 Susceptor
21 Counterbore part
30 Susceptor main body
31 Recessed part
32 Front surface outermost circumferential part of susceptor main body
32A Wafer supporting surface
32B Vertical wall surface
33 Front surface middle part of susceptor main body
34 Inclined surface
35 Front surface central part of susceptor main body (or bottom surface of recessed part)
36 Penetration hole
37A Vertical surface
37B Inclined surface
38A First vertical surface
38B Horizontal surface
38C Second vertical surface
40 Plate-shaped member
41 Front surface of plate-shaped member
42 Back surface of plate-shaped member
43 inclined surface
44 Lift pin
45A Vertical surface
45B Inclined surface
46 First part
46A First vertical surface
47 Second part
47A Second vertical surface
47B Second part periphery
48 Horizontal surface
50 Susceptor support shaft
52 Main column
54 Arm
56 Penetration hole
58 Supporting pin
60 Ascending/descending shaft
62 Main column
64 Support column
66 Tip part of support column
70 Wafer conveying blade
72 Wafer supporting part
W Wafer

The invention claimed is:

1. A susceptor for placing a wafer thereon within an epitaxial growth device, wherein
a counterbore part for placing the wafer thereon is formed on a front surface of the susceptor,
the susceptor has a susceptor main body and a plate-shaped member placed on a recessed part, the recessed part having a bottom surface and provided in a central part of a front surface of the susceptor main body,
a bottom surface of the counterbore part is constituted of a front surface of the plate-shaped member, and a part of the front surface of the susceptor main body, located around the recessed part,
the susceptor main body is provided with penetration holes, for lift pins that support a back surface of the plate-shaped member, and ascend and descend the plate-shaped member, to be inserted therethrough,
when the wafer is being placed on the counterbore part and when the wafer is carried out of the counterbore part, the front surface of the plate-shaped member ascended by the lift pins acts as a supporting surface for supporting at least a central part of a back surface of the wafer by surface contact, and
a separation space diagonally extending between an inclined outermost edge of the plate-shaped member and an inclined inner surface of the susceptor main body, in a direction toward a central axis of the susceptor main body, in a lowermost position of the plate-shaped member on the susceptor main body, the central axis extending in a direction along an ascending and descending direction of the lift pins.

2. The susceptor according to claim 1, wherein the lift pins are fixed to the plate-shaped member.

3. An epitaxial growth device comprising:
the susceptor according to claim 1, and
an ascending/descending shaft for ascending and descending the lift pins by supporting a lower end of the lift pins.

4. The susceptor according to claim 1, wherein the inclined outermost edge of the plate-shaped member and the inclined inner surface of the susceptor main body are in parallel.

5. The susceptor according to claim 1, wherein a distance of a gap between the plate-shaped member and the susceptor main body is constant in the circumferential direction.

6. The susceptor according to claim 1, wherein the inclined outermost edge of the plate-shaped member and the inclined inner surface of the susceptor main body have an equal inclination angle, and the inclination angle with respect to the vertical direction is 30 to 45 degrees.

7. The susceptor according to claim 1, wherein the periphery of the plate-shaped member has a vertical surface that extends from the front surface of the plate-shaped member to the inclined outermost edge.

8. A susceptor for placing a wafer thereon within an epitaxial growth device, the susceptor comprising:
a counterbore part for placing the wafer thereon formed on a front surface of the susceptor,
a susceptor main body;
a recessed part having a bottom surface and provided in a central part of a front surface of the susceptor main body and having a stepped part; and
a plate-shaped member placed on the recessed part and having a first part with a first radius $r1$, and a second part with a second radius $r2$ that is larger than $r1$ on the first part, wherein:
a bottom surface of the counterbore part is constituted of a front surface of the plate-shaped member, and a part of the front surface of the susceptor main body, located around the recessed part,
the susceptor main body is provided with penetration holes, for lift pins that support a back surface of the plate-shaped member, and ascend and descend the plate-shaped member, to be inserted therethrough,
when the wafer is being placed on the counterbore part and when the wafer is carried out of the counterbore part, the front surface of the plate-shaped member ascended by the lift pins acts as a supporting surface for supporting at least a central part of a back surface of the wafer by surface contact,
a first separation space corresponding to the first part and a second separation space corresponding to the second part, each separation space located between the plate-shaped member and the susceptor main body and defined by the stepped part, in a state in which the plate-shaped member is placed on the recessed part, and each separation space extends toward a central axis of the susceptor main body, such that the first separation space extends closer to the central axis than the second separation space extends, and
the stepped part supports a periphery of the second part.

9. The susceptor according to claim 8, wherein the first radius $r1$ of the first part is 1.0 to 5.0 mm smaller than the second radius $r2$, and a width of the stepped part is equal to $r2-r1$.

* * * * *